United States Patent [19]

Ohsawa

[11] Patent Number: 5,323,345
[45] Date of Patent: Jun. 21, 1994

[54] SEMICONDUCTOR MEMORY DEVICE HAVING READ/WRITE CIRCUITRY

[75] Inventor: Takashi Ohsawa, Yokohama, Japan

[73] Assignee: Kabushiki Kaisha Toshiba, Kawasaki, Japan

[21] Appl. No.: 676,073

[22] Filed: Mar. 27, 1991

[30] Foreign Application Priority Data

Mar. 30, 1990 [JP] Japan ................................ 2-84609

[51] Int. Cl.$^5$ ...................... G11C 7/06; G11C 11/407; H03F 3/45
[52] U.S. Cl. .............................. 365/189.01; 365/205; 365/207; 365/208; 307/530
[58] Field of Search ........... 365/149, 154, 156, 189.01, 365/190, 204, 205, 206, 207, 208; 307/350, 530

[56] References Cited

U.S. PATENT DOCUMENTS

| | | | |
|---|---|---|---|
| 4,954,992 | 9/1990 | Kumanoya et al. | 365/189.01 |
| 5,027,325 | 6/1991 | Katsura | 365/208 |
| 5,132,930 | 7/1992 | Furutani et al. | 365/190 |
| 5,146,427 | 9/1992 | Sasaki et al. | 365/190 |

Primary Examiner—Glenn Gossage
Assistant Examiner—Jack A. Lane
Attorney, Agent, or Firm—Banner, Birch, McKie & Beckett

[57] ABSTRACT

A dynamic type semiconductor memory device is disclosed which includes a plurality of memory cells, plural pairs of bit lines for supplying data to the plurality of memory cells, a first sense amplifier arranged for each of the plural pairs of bit lines, for amplifying a bit line signal, a pair of data input/output lines consisting of first and second data input/output lines, for extracting data from the plural pairs of bit lines, a second sense amplifier arranged for each of the plural pairs of bit lines and consisting of first and second driver MOS transistors for extracting charges from the data input/output lines in a data reading operation, and for amplifying a data input/output line signal, first and second column selecting transistors which are inserted between the pair of data input/output lines and the second sense amplifier and gates of which are connected to a column selecting line, and first and second write transistors, the first and second write transistors being turned on in a data writing operation.

14 Claims, 9 Drawing Sheets

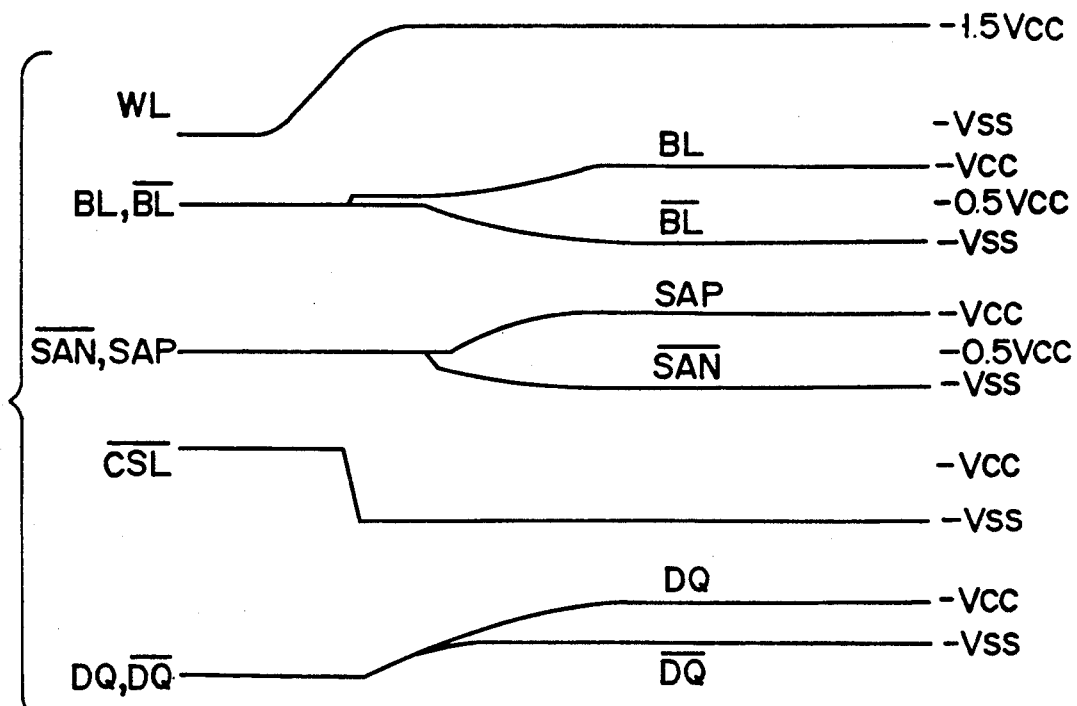
F I G. 7
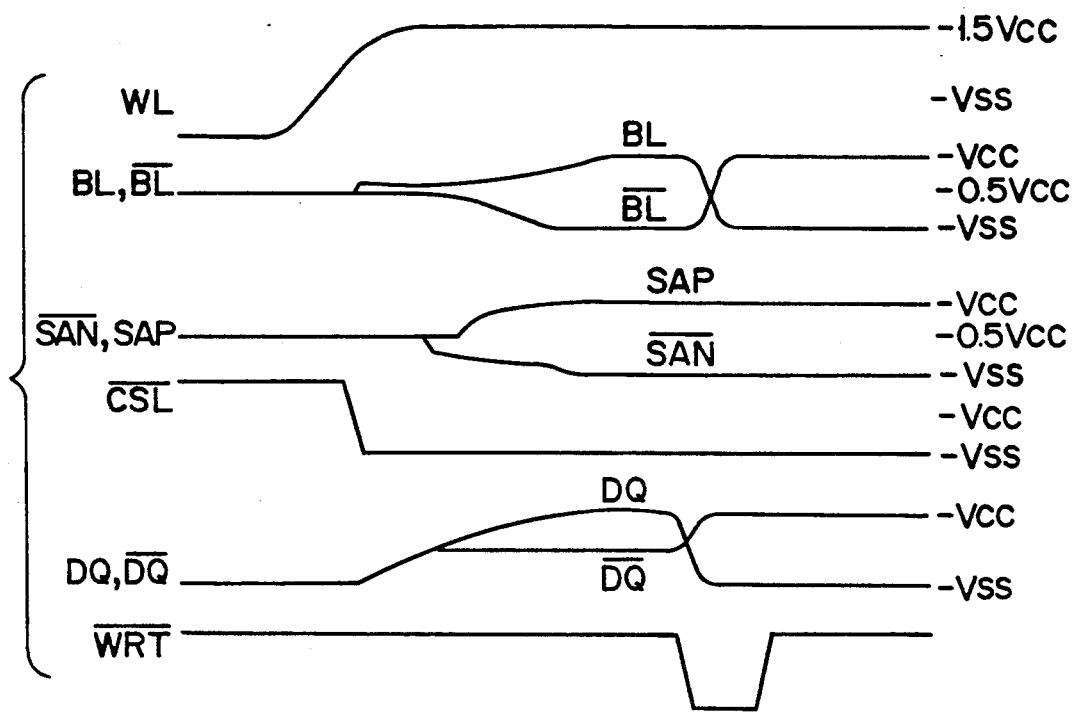
F I G. 8

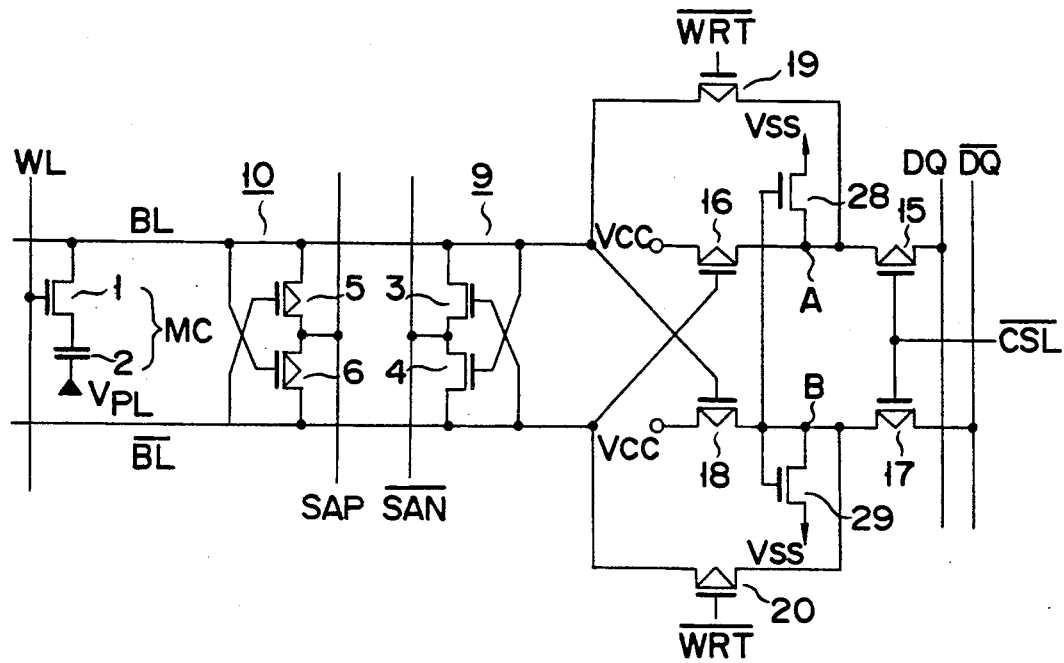
F I G. 13
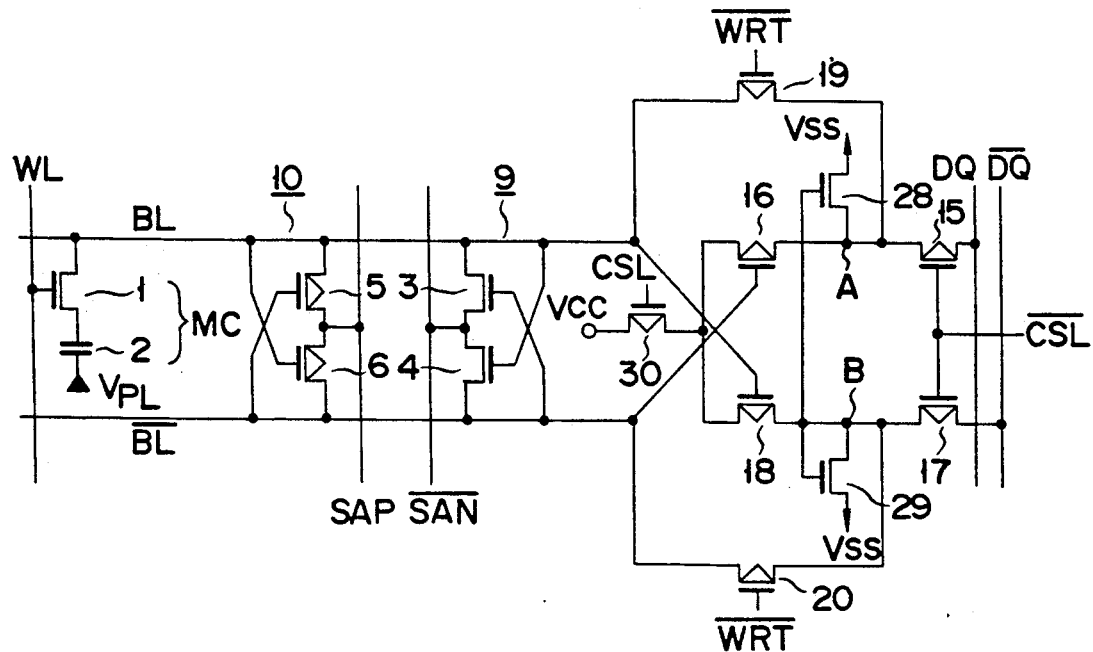
F I G. 14

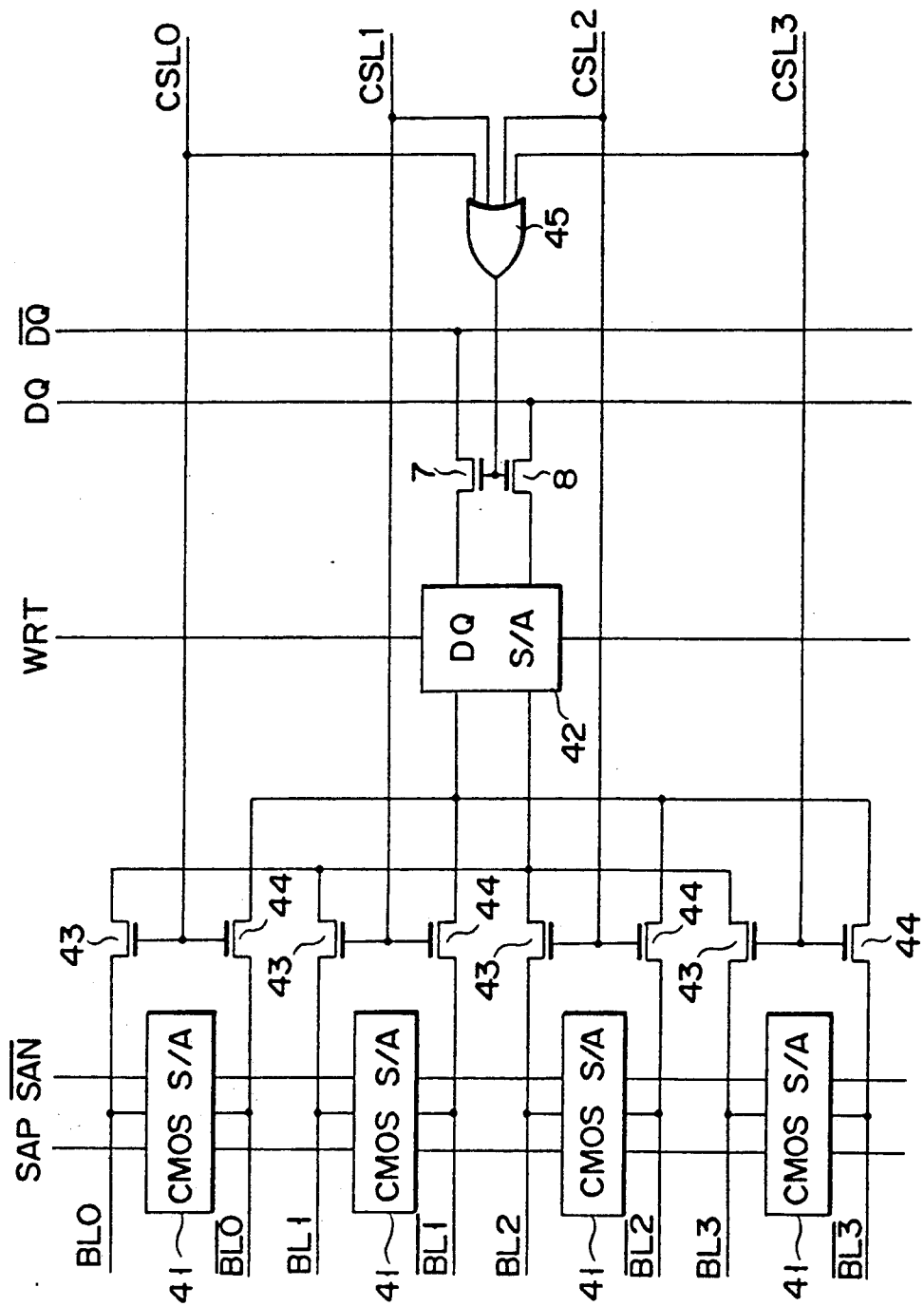
F I G. 15

SEMICONDUCTOR MEMORY DEVICE HAVING READ/WRITE CIRCUITRY

BACKGROUND OF THE INVENTION

1. Field of the Invention

The present invention relates to a dynamic type semiconductor memory device having a sense amplifier for amplifying and outputting a micro signal on a bit line.

2. Description of the Related Art

The arrangement of a sense amplifier section in a conventional dynamic type semiconductor memory device (to be referred to as a DRAM hereinafter) is shown in FIG. 1, and operational waveforms thereof are illustrated in a timing chart in FIG. 2.

That is, when a signal from a word line WL rises, a MOS transistor 1 in a memory cell MC is turned on, and a signal corresponding to data stored in a capacitor 2 is read to a bit line BL, thereby generating a micro potential difference between a pair of bit lines BL and $\overline{BL}$. Thereafter, when a signal from a sense amplifier control line $\overline{SAN}$ for activating an n-channel side sense amplifier consisting of two n-channel MOS transistors 3 and 4 is dropped from $0.5 \cdot V_{CC}$ to $V_{SS}$, a potential of the low-potential side bit line ($\overline{BL}$ in FIG. 2) is decreased sequentially from $0.5 \cdot V_{CC}$ to $V_{SS}$. Thereafter, when a signal from a sense amplifier line SAP for activating a p-channel side sense amplifier consisting of two p-channel MOS transistors 5 and 6 is raised from $0.5 \cdot V_{CC}$ to $V_{CC}$ a potential of the high-potential side bit line (BL in FIG. 2) is increased sequentially from $0.5 \cdot V_{CC}$ to $V_{CC}$. When the potential difference between the bit lines BL and $\overline{BL}$ is sufficiently large, a signal from a column selecting line CSL is raised, and a pair of column selecting n-channel MOS transistors 7 and 8 are turned on, thereby causing a signal to appear from a pair of input/output lines DQ and $\overline{DQ}$ precharged to be $V_{CC}$ in advance.

In a conventional DRAM, a signal from a pair of bit lines cannot be disadvantageously transmitted to a pair of data input/output lines at a high speed, because a potential of the column selecting line CSL cannot be raised unless the potential difference between a pair of bit lines is sufficiently amplified. If the potential of the column selecting line CSL is raised when the potential difference between the pair of bit lines is small, the potentials of the pair of bit lines come to a floating state due to an entrance of charges from the precharged to the pair of data input/output lines, and data may be erroneous due to unbalance of the potentials of the pair of bit lines. In addition, when an integration density of memory cells in a DRAM is increased, a time required for amplifying the potential difference between the pair of bit lines is further prolonged. Therefore, since a delay time of the sense amplifier section occupies a very large part in an access time, the delay time will be further increased in the future.

SUMMARY OF THE INVENTION

The present invention has been made in consideration of the above description, and has as its object to provide a dynamic type semiconductor memory device in which signal transmission in a data read path from a bit line to a data input/output line is rarely delayed, thereby obtaining a high-speed operation.

According to the present invention, there is provided to a dynamic type semiconductor memory device comprising plural pairs of bit lines for supplying data to a plurality of memory cells, a first sense amplifier arranged for each of the plural pairs of bit lines, for amplifying a bit line signal, a pair of data input/output lines for extracting data from the pairs of bit lines, two driver MOS transistors which are arranged for and connected to each of the pairs of bit lines, a second sense amplifier for amplifying a signal from the pair of data input/output lines in a data reading operation, a pair of column selecting transistors which are arranged between the pair of data input/output lines and the second sense amplifier and gates of which are connected to a column selecting line, and a pair of write transistors arranged between the pair of data input/output lines and the pair of bit lines and rendered conductive in a data writing operation.

In addition to the first sense amplifier for amplifying a bit line signal, the second sense amplifier for amplifying a signal from a pair of data input/output lines in a data reading operation is arranged, and a pair of bit lines are connected to the gates of the two driver MOS transistors constituting the second sense amplifier. Therefore, the signal from the pair of data input/output lines can be amplified without any influence on an amplification operation for the bit line signal in the first sense amplifier. Since the second sense amplifier is arranged, the bit line signal and the data input/output line signal can be started to be almost simultaneously amplified.

BRIEF DESCRIPTION OF THE DRAWINGS

The accompanying drawings, which are incorporated in and constitute a part of the specification, illustrate presently preferred embodiments of the invention, and together with the general description give above and the detailed description of the preferred embodiments given below, serve to explain the principles of the invention.

FIGS. 7 and 8 are timing charts showing an operation of the DRAM according to the second embodiment;

FIG. 13 is a circuit diagram showing an arrangement of a DRAM according to the seventh embodiment of the present invention;

FIG. 14 is a circuit diagram showing an arrangement of a DRAM according to the eighth embodiment of the present invention;

FIG. 15 is a circuit diagram showing an arrangement of a DRAM according to the ninth embodiment of the present invention.

DETAILED DESCRIPTION OF THE PREFERRED EMBODIMENTS

Embodiments of the present invention will be described below with reference to the accompanying drawings.

Figure 3:
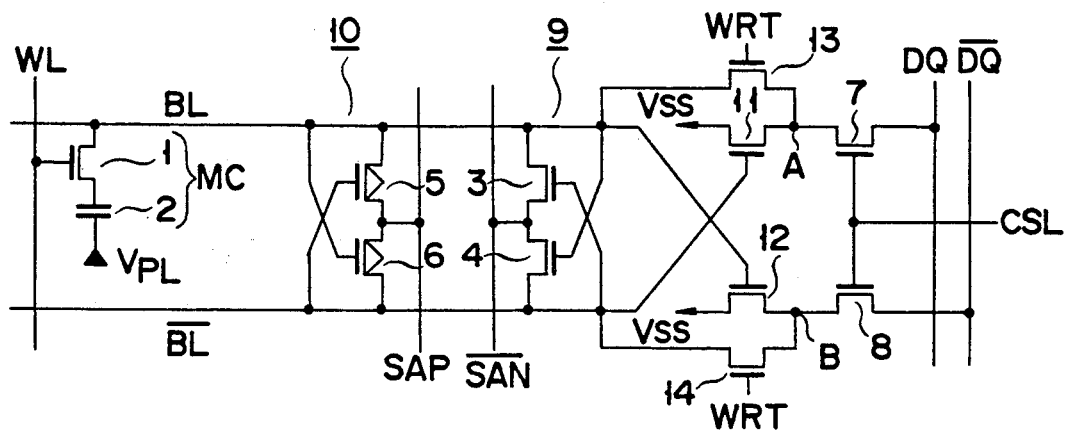
FIG. 3 is a circuit diagram showing an arrangement of a DRAM according to the first embodiment of the present invention.

FIG. 3 is a circuit diagram showing an arrangement of a DRAM according to the first embodiment of the present invention. A plurality of memory cells MC (only one is illustrated) are connected to a word line WL. As shown in FIG. 3, each of the memory cells MC consists of a selecting MOS transistor 1 and a data memory capacitor 2. The gate of the selecting MOS transistor 1 is connected to the word line WL, and the source or drain of the transistor connected to an electrode opposite to an electrode to which a predetermined potential $V_{PL}$ of the capacitor 2 is applied is connected to a corresponding bit line BL or $\overline{BL}$ (BL side in FIG. 3).

An n-channel side sense amplifier 9 consisting of two n-channel MOS transistors 3 and 4 and a p-channel side sense amplifier 10 consisting of two p-channel MOS transistors 5 and 6 are connected between the pair of bit lines BL and $\overline{BL}$. The drain and gate of the transistor 3 of the n-channel side sense amplifier 9 are connected to the bit lines BL and $\overline{BL}$, respectively, and the drain and gate of the transistor 4 are connected to the bit lines $\overline{BL}$ and BL, respectively. The sources of both the transistors 3 and 4 are commonly connected to each other. That is, the two transistors 3 and 4 are connected to be operated as a flip-flop, and the common source of the transistors 3 and 4 is connected to a sense amplifier control line $\overline{SAN}$ for activating the sense amplifier 9. The drain and gate of the transistor 5 of the p-channel sense amplifier 10 are connected to the bit lines BL and $\overline{BL}$, respectively, and the drain and gate of the transistor 6 are connected to the bit lines $\overline{BL}$ and BL, respectively, and the sources of both the transistors 5 and 6 are connected to each other. That is, the two transistors 5 and 6 are connected to be operated as a flip-flop, and the common source of the transistors 5 and 6 is connected to a sense amplifier control line SAP for activating the sense amplifier 10. A bit line sense amplifier for amplifying a potential difference between the pair of bit lines consists of the n-channel side sense amplifier 9 and the p-channel side sense amplifier 10.

A column selecting n-channel MOS transistor 7 and a data input/output line signal amplifying n-channel MOS transistor 11 are connected in series between one data input/output line DQ of a pair of data input/output lines and a ground potential $V_{SS}$, and a column selecting n-channel MOS transistor 8 and a data input/output line signal amplifying n-channel MOS transistor 12 are connected in series between the other data input/output line $\overline{DQ}$ the ground potential $V_{SS}$. The gates of both the column selecting transistors 7 and 8 are connected to the same column selecting line CSL, the gate of the transistor 11 of the two data input/output line signal amplifying transistors is connected to the bit line $\overline{BL}$, and the gate of the other transistor 12 is connected to the bit line BL. That is, a data input/output line sense amplifier for amplifying a potential difference between the pair of data input/output lines in accordance with signals from the bit lines BL and $\overline{BL}$ consists of the two transistors 11 and 12, and both the transistors 11 and 12 serve as driver transistors.

A data write n-channel MOS transistor 13 is connected between a common connection node A of the transistors 7 and 11 and the bit line BL, a data write n-channel MOS transistor 14 is connected between a common connection node B of the transistors 8 and 12 and the bit line $\overline{BL}$. The gates of both the data write transistors 13 and 14 are connected to a data write control line WRT and simultaneously ON/OFF-controlled by a signal from the signal line WRT.

Figure 4:
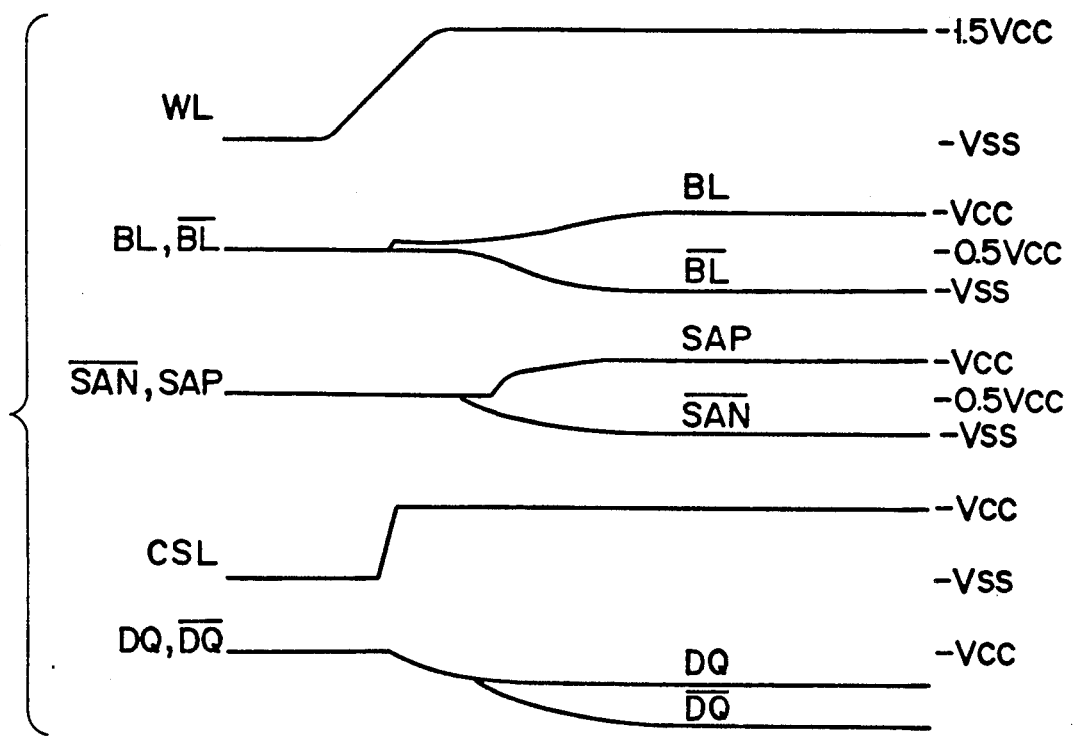
FIGS. 4 and 5 are timing charts showing an operation of the DRAM according to the first embodiment.

An operation of the DRAM with the above arrangement will be described below with reference to timing charts in FIGS. 4 and 5. FIG. 4 is a timing chart in a data reading state. A signal from the word line WL rises first. Substantially at the same time, a signal of the column selecting line rises. When a signal from the word line WL rises, the MOS transistor 1 in the memory cell MC is turned on, and a signal corresponding to data stored in the capacitor 2 is read out on the bit line BL side. In this case, since potentials of the bit lines BL and $\overline{BL}$ are precharged to a potential $0.5 \cdot V_{CC}$ which is equal to half the power source potential $V_{CC}$ in advance by a means (not shown), the transistors 11 and 12 are simultaneously turned on. Therefore, when the transistors 7 and 8 are turned on in response to a signal from the column selecting line CSL, charges in the data input/output line DQ are extracted through the transistors 7 and 11 connected in series, and charges of the data input/output line $\overline{DQ}$ are extracted through the transistors 8 and 12 connected in series. That is, potentials of the pair of data input/output lines having a parasitic capacitances larger than those of the pair of bit lines are decreased.

When a signal from the word line WL completely reaches "H" level (level generally obtained by bootstrapping the power source potential $V_{CC}$, e.g., $1.5 \cdot V_{CC}$), a signal from the sense amplifier control line $\overline{SAN}$ for activating the n-channel side sense amplifier 9 is dropped from $0.5 \cdot V_{CC}$ to the ground potential $V_{SS}$. Thus, a low-potential bit line (in this case, the bit line $\overline{BL}$) of the pair of bit lines is sequentially dropped to the $V_{SS}$ side. In this case, a speed of decreasing the potential of the bit line $\overline{BL}$ is low because the number of memory cells connected to one word line is very large, for example, a word line has 1,024 memory cells in a 4-Mbit DRAM. Therefore, since the number of n-channel side sense amplifiers is equal to the number of memory cells, a large amount of charges must be extracted through the common signal line $\overline{SAN}$, and a speed of extracting charges is to be low by an influence of a line resistance present on the signal line $\overline{SAN}$. This tendency will be more conspicuous as an integration density of memory cells is increased, e.g., from a 16-Mbit DRAM to a 64-Mbit DRAM.

The signal of the sense amplifier control line $\overline{SAN}$ is dropped, and after a short time, the signal from the sense amplifier control line SAP for activating the p-channel side sense amplifier 10 rises from $0.5 \cdot V_{CC}$ to $V_{CC}$. Therefore, the high-potential side bit line (in this case, the bit line BL) sequentially rises to $V_{CC}$. In this case, a speed of increasing the potential is very low because of the same reason as described above. When a potential difference is generated between the pair of bit lines, the conductances of the transistors 11 and 12 the gates of which receive the signals of both the bit lines are different from each other. In this case, the transistor 12 the gate of which receives the signal from the high-potential bit line BL has a conductance higher than that of the transistor 11 the gate of which receives the signal from the low-potential bit line $\overline{BL}$. Therefore, the speeds of extracting charges from the pair of data input-/output lines DQ and $\overline{DQ}$ are different from each other, and the potential of the data input/output line $\overline{DQ}$ is decreased earlier than that of the data input/output line DQ. When the potential of the data input/output line $\overline{DQ}$ is further decreased and has a voltage lower than a threshold voltage $V_{TH}$ of the n-channel MOS transistor 11, the transistor 11 is set in a cutoff state, and the decrease in potential of the data input/output line $\overline{DQ}$ is stopped. Thus, data read out to the pair of bit lines is transmitted to the pair of data input/output lines.

In a data reading operation, since a column selecting line CSL can be activated earlier than the signals $\overline{SAN}$ and SAP for respectively activating the n-channel side sense amplifier 9 and the p-channel side sense amplifier 10, the signals from the pair of bit lines and the signals from the pair of data input/output lines can be almost simultaneously amplified. Since signal transmission from the pair of bit lines to the pair of data input/output lines through a data reading path is rarely delayed, the data can be read out at a high speed.

Figure 5:
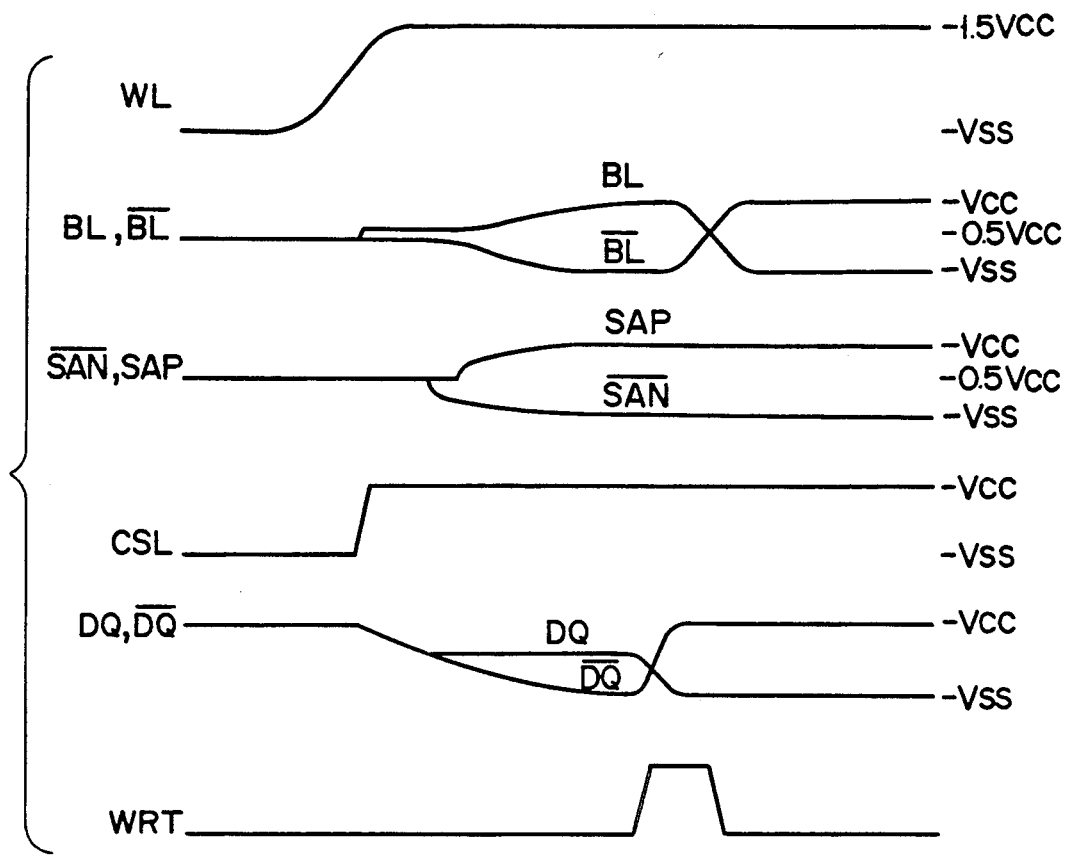

FIG. 5 is a timing chart in a data reading state, a signal of the word line WL rises first, and the same data reading operation as described in FIG. 4 is performed. When this reading operation is completed, a signal from the data writing control line WRT rises as a pulse. At the same time, the potentials of the pair of data input-/output lines DQ and $\overline{DQ}$ are set by a write circuit (not shown). FIG. 5 shows a case wherein data having a level opposite to the read data is written, and the potentials of the pair of data input/output lines DQ and $\overline{DQ}$ are reversed to each other. At this time, since the signal from the signal line WRT is set to be "H" level, the data write transistors 13 and 14 are turned on. Therefore, the signal potential of the bit line BL set at "H" level is decreased to "L" level through the transistors 7 and 11, and the signal potential of the bit line $\overline{BL}$ set at "L" level is increased to "H" level through the transistors 8 and 12. The n-channel side sense amplifier 9 and the p-channel side sense amplifier 10 latch new written data. At this time, the transistor 11 is turned on, and the transistor 12 is turned off, thereby completing the data writing operation. Even when driving of the pair of data input-/output lines DQ and $\overline{DQ}$ by a write circuit is stopped, the potential of the data input/output line DQ is decreased to "L" level, and the potential of the data input-/output line $\overline{DQ}$ is held to be "H" level. Thus, the data writing operation is completed.

In the data writing operation shown in the timing chart in FIG. 5, although data is written after a data reading operation is completed, a timing of the writing operation may be advanced, and the writing operation may be started before the data reading operation is completed. That is, only the writing operation is started after the bit line sense amplifier is activated. In this embodiment, although data is read out while the data input/output line is precharged to $V_{CC}$, the potential is not limited to the potential $V_{CC}$, and the potential can be precharged to, e.g., $0.5 \cdot V_{CC}$.

Figure 1:
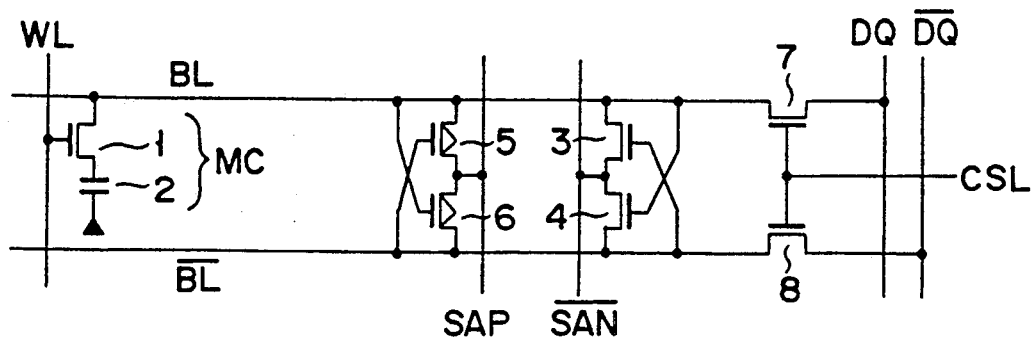
FIG. 1 is a circuit diagram showing a conventional DRAM.
Figure 2:
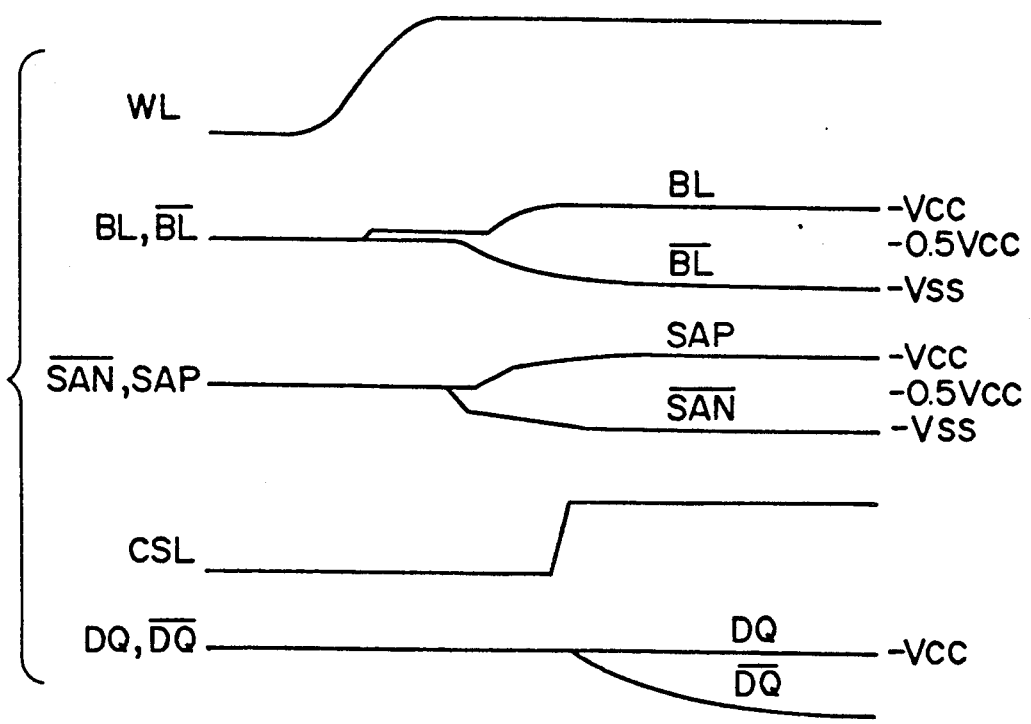
FIG. 2 is a timing chart of the conventional DRAM shown in FIG. 1.
Figure 6:
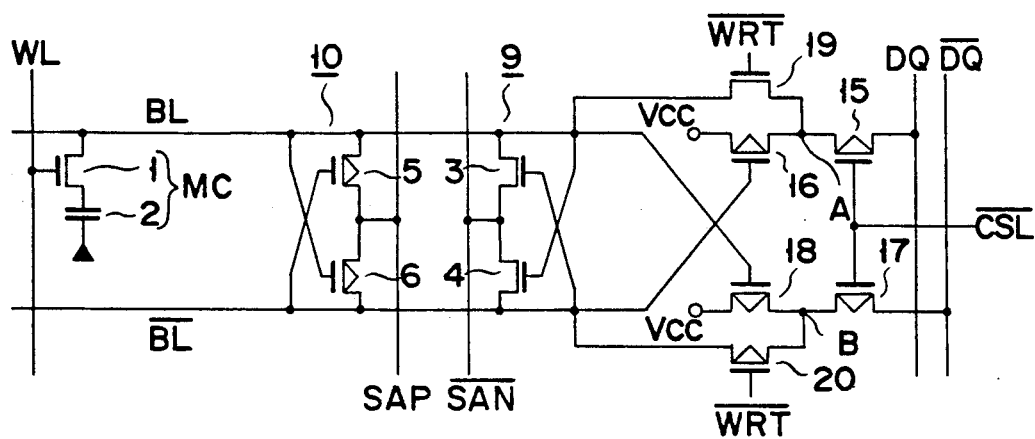
FIG. 6 is a circuit diagram showing an arrangement of a DRAM according to the second embodiment of the present invention.

FIG. 6 is a circuit diagram showing an arrangement of a DRAM according to the second embodiment of the present invention. In the DRAM according to the first embodiment in FIG. 1, the column selecting MOS transistors 7 and 8, the data input/output line signal amplifying MOS transistors 11 and 12, and the data writing MOS transistors 13 and 14 are n-channel transistors, and one terminal of each of the data input/output line signal amplifying MOS transistors 11 and 12 is connected to the ground potential $V_{SS}$. However, in a DRAM according to the second embodiment, p-channel MOS transistors are used in place of the above n-channel MOS transistors.

That is, a column selecting p-channel MOS transistor 15 and a data input/output line signal amplifying p-channel MOS transistor 16 are connected in series between one data input/output line DQ of a pair of data input/output lines and a potential $V_{CC}$, and a column selecting p-channel MOS transistor 17 and a data input-/output line signal amplifying p-channel MOS transistor 18 are connected in series between the other data input/output line $\overline{DQ}$ and the power source potential $V_{CC}$. The gates of both the column selecting transistors 15 and 17 are commonly connected to a column selecting line $\overline{CSL}$ which receives an "L"-level signal in an active state. The gate of the transistor 16 of the data input/output line signal amplifying transistors is connected to the bit line $\overline{BL}$, and the gate of the transistor 18 is connected to the bit line BL. That is, a data input-/output sense amplifier for amplifying a potential difference between the pair of data input/output lines in accordance with the signals from the bit lines Bl and $\overline{BL}$ consists of both the transistors 16 and 18. In this case, both the transistors 16 and 18 are driver transistors.

A data writing p-channel MOS transistor 19 is connected between a common connection node A of the transistors 15 and 16 and the bit line BL, and a data write p-channel MOS transistor 20 is connected between a common connection node B of the transistors 17 and 18 and the bit line $\overline{BL}$. The gates of both the data writing transistors 19 and 20 are connected to a data write control line $\overline{WRT}$ receiving an "L"-level signal in an active state and simultaneously ON/OFF-controlled by a signal from the signal line $\overline{WRT}$.

An operation of the DRAM with the above arrangement will be described with reference to the timing charts in FIGS. 7 and 8. FIG. 7 is a timing chart in a data reading operation. A signal from a word line WL rises first, and a signal corresponding to data is read out to the pair of bit lines. Thereafter, a signal from a sense amplifier control line $\overline{SAN}$ for activating the n-channel side sense amplifier 9 and a signal from a sense amplifier control line SAP for activating the p-channel side sense amplifier 10 are sequentially activated, and a potential difference between the pair of bit lines is amplified by both the sense amplifiers.

The potential from a signal of the column selecting line $\overline{CSL}$ is precharged to a potential $V_{CC}$ in advance, and the potential is decreased to a ground potential $V_{SS}$ after the signal from the word line WL rises. Therefore, charges are supplied from the power source potential VCC to the pair of data input/output lines which are precharged to the ground potential $V_{SS}$ by a means (not shown) through the series-connected transistors 15 and 17 and the series-connected transistors 16 and 18, respectively. The signals from the pair of bit lines are amplified by the bit line sense amplifiers. At the same time, the pair of data input/output lines have a potential difference due to a conductance difference between the transistors 16 and 18. Thus, the data read from the pair of bit lines are transmitted to the pair of data input/output lines.

In this embodiment, since the column selecting line $\overline{CSL}$ can be activated earlier than the signals $\overline{SAN}$ and SAP for respectively activating the n-channel side sense amplifier 9 and the p-channel side sense amplifier 10 during a data reading operation, the signals from the pair of bit lines and the signals from the pair of data input/output lines can be almost simultaneously amplified. In this case, since signal transmission from the pair of bit lines to the pair of data input/output lines through a data reading path is rarely delayed, the data can be read at a high speed.

FIG. 8 is a timing chart in a data writing operation. A signal from the word line WL rises first, and the same data reading operation as described in FIG. 7 is performed. When this reading operation is completed, a signal from the data writing control line $\overline{WRT}$ rises as a pulse, and at the same time, the potentials of the pair of data input/output lines DQ and $\overline{DQ}$ are set by a write circuit (not shown). In FIG. 8, data having a level opposite to that of the read data is written, and the potentials of the pair of data input/output lines DQ and $\overline{DQ}$ are reversed to each other. At this time, since the signal from the signal line $\overline{WRT}$ is set to be "L" Level, the data writing transistors 19 and 20 are tuned on, and the data of the of data input/output lines are transmitted to the pair of bit lines. The n-channel side sense amplifier 9 and the p-channel side sense amplifier 10 latch new written data. At this time, the transistor 18 is turned on, and the transistor 16 is turned off, thereby completing the data writing operation. Even when driving of the pair of data input/output lines DQ and $\overline{DQ}$ by the write circuit is stopped, the potential of the data input/output line DQ is decreased to "L" level, and the potential of the data input/output line is held to be "H" level. Thus, the data writing operation is completed.

Figure 9:
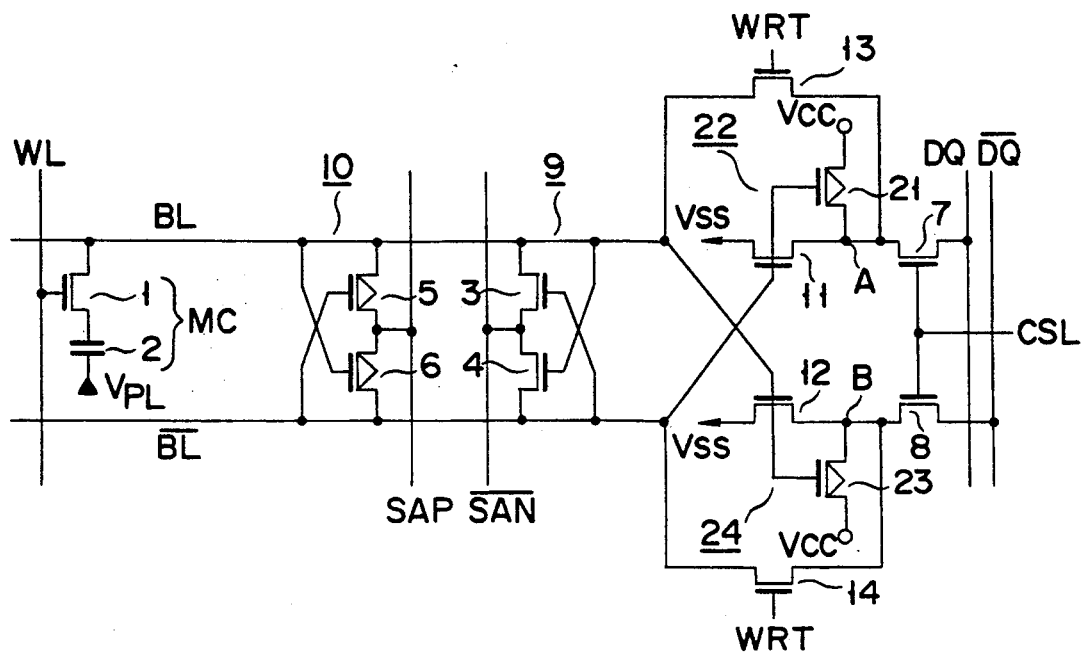
FIG. 9 is a circuit diagram showing an arrangement of a DRAM according to the third embodiment of the present invention.

FIG. 9 is a circuit diagram showing an arrangement of a DRAM according to the third embodiment of the present invention.

In the DRAM according to this embodiment, a load p-channel MOS transistor 21 is inserted between the node A and the power source potential $V_{CC}$ of the DRAM of the embodiment in FIG. 3, and the gate of the MOS transistor 21 is connected to the gate of the data input/output line signal amplifying n-channel MOS transistor 11, thereby constituting a CMOS inverter 22. In addition, a load p-channel MOS transistor 23 is inserted between the node B and the power source potential $V_{CC}$, and the gate of the MOS transistor 23 is connected to the gate of the data input/output line signal amplifying n-channel MOS transistor 12, thereby constituting a CMOS inverter 24.

In the DRAM according to the third embodiment, although the number of elements is increased by an increase in the load p-channel MOS transistors 21 and 23 compared with that of the embodiment in FIG. 3, the amplification of the pair of data input/output lines is advantageously increased.

Figure 10:
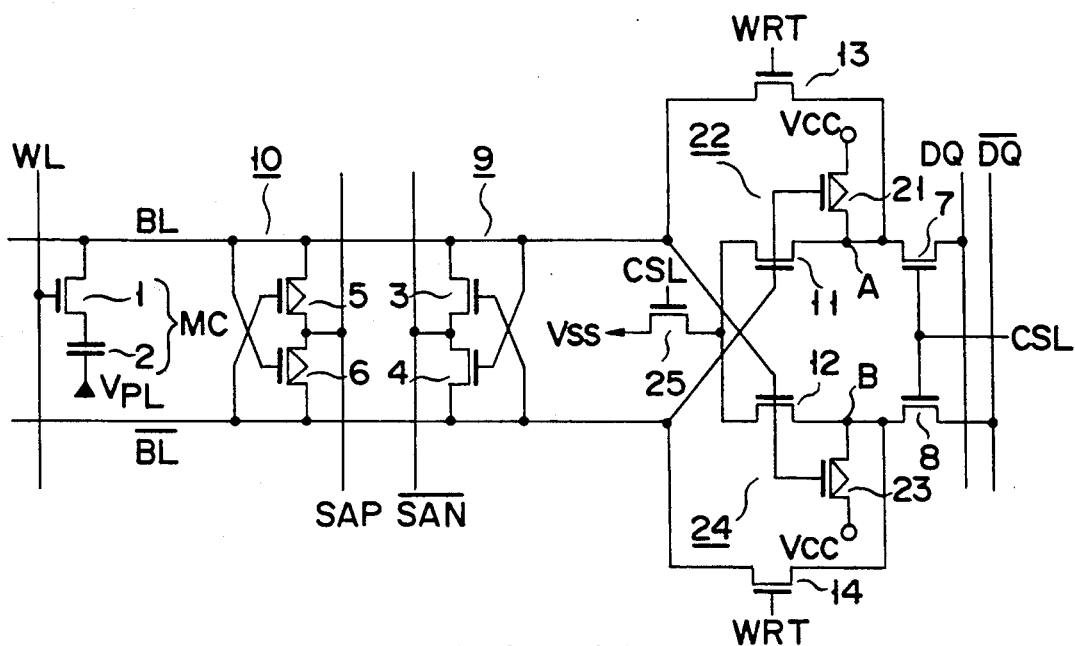
FIG. 10 is a circuit diagram showing an arrangement of a DRAM according to the fourth embodiment of the present invention.

FIG. 10 is a circuit diagram showing an arrangement of a DRAM according to the fourth embodiment of the present invention.

In the DRAM of this embodiment, in place of connecting one terminal of each of the n-channel transistors 11 and 12 to the ground potential $V_{SS}$ in the DRAM according to the third embodiment in FIG. 9, a through current control n-channel MOS transistor 25 is inserted between both the transistors 11 and 12 and the ground potential $V_{SS}$ and the gate of the transistor 25 is connected to a column selecting line CSL.

In the DRAM according to this embodiment, when column selecting transistors 7 and 8 are turned on in response to a signal from the column selecting line CSL, the through current control transistor 25 on only the selected column is turned on, and through current control transistors 25 on non-selected columns are turned off. For this reason, the large number of non-selected data input/output line sense amplifiers can be prevented from a through current flow, and low power consumption can be achieved.

Figure 11:
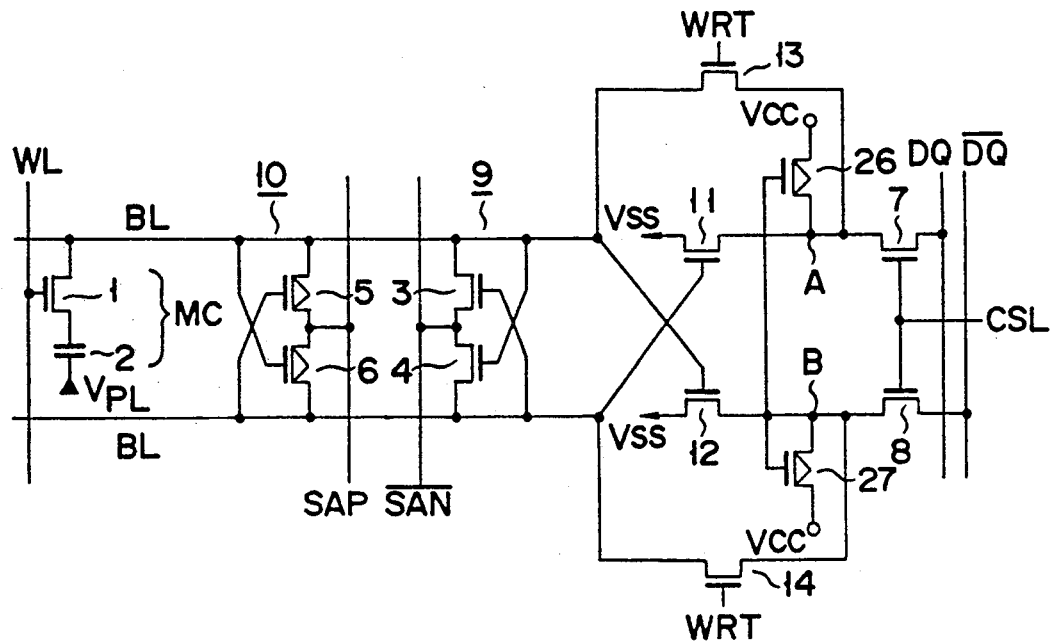
FIG. 11 is a circuit diagram showing an arrangement of a DRAM according to the fifth embodiment of the present invention.

FIG. 11 is a circuit diagram showing an arrangement of a DRAM according to the fifth embodiment of the present invention.

In the DRAM of this embodiment, a load p-channel MOS transistor 26 is inserted between the node A and the power source potential $V_{CC}$, and a load p-channel MOS transistor 27 is inserted between the node B and the power source potential $V_{CC}$, in the first embodiment in FIG. 3. In addition, the gates of both the transistors 26 and 27 are commonly connected to the node B so as to add p-channel current mirror loads to the data input/output signal amplifying n-channel MOS transistors 11 and 12.

In the DRAM according to this embodiment, although the number of elements is increased by an increase in the load p-channel MOS transistors 26 and 27 compared with the first embodiment in FIG. 3, the amplification of the pair of data input/output lines is advantageously increased.

Figure 12:
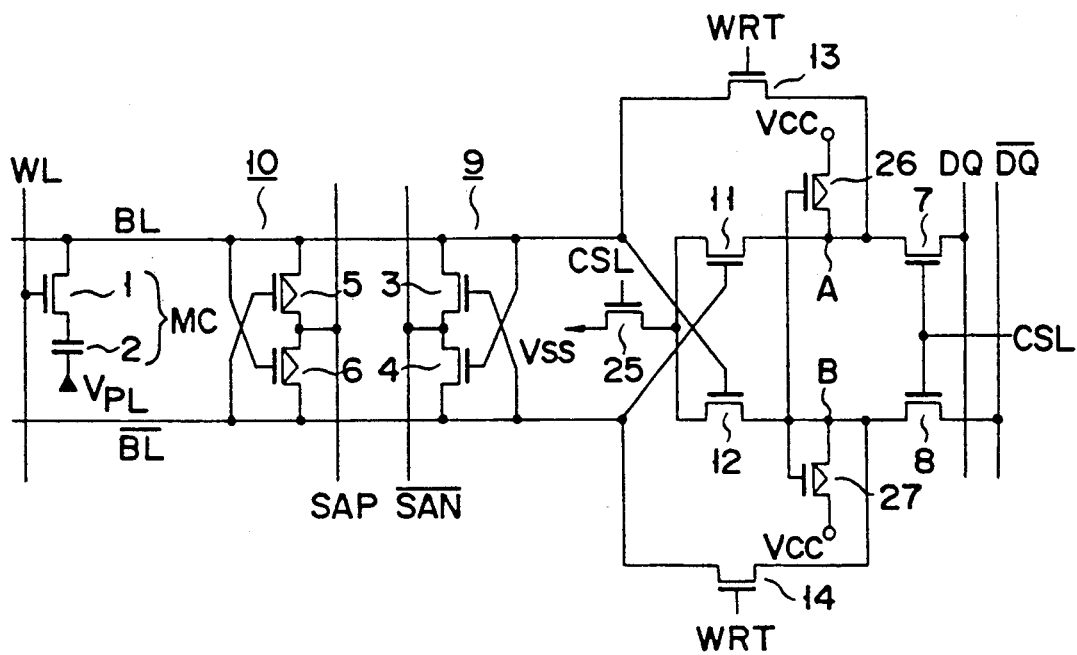
FIG. 12 is a circuit diagram showing an arrangement of a DRAM according to the sixth embodiment of the present invention.

FIG. 12 is a circuit diagram showing an arrangement of a DRAM according to the sixth embodiment of the present invention.

In the DRAM of this embodiment, in place of directly connecting one terminal of each of the channel MOS transistors 11 and 12 to the ground potential $V_{SS}$ in the DRAM according to fifth embodiment in FIG. 11, a through current control n-channel MOS transistor 25 is inserted between both the transistors 11 and 12 and the ground potential $V_{SS}$, and the gate of the transistor 25 is connected to a column selecting line CSL. As in the fourth embodiment in FIG. 10, a large number of non-selected data input/output line sense amplifiers can be prevented from a through current flow.

FIG. 13 is a circuit diagram showing an arrangement of a DRAM according to the seventh embodiment of the present invention. In the above embodiment in FIG. 11, the column selecting MOS transistors 7 and 8, the data input/output line signal amplifying MOS transistors 11 and 12, and the data write MOS transistors 13 and 14 are n-channel transistors, the current mirror loads of the MOS transistors 11 and 12 consist of the p-channel MOS transistors 26 and 27, and one terminal of each of the MOS transistors 11 and 12 is connected to the ground potential $V_{SS}$. In the DRAM of the seventh embodiment, however opposite channel MOS transistors are used as the MOS transistors described in the fifth embodiment, respectively.

That is, a column selecting p-channel MOS transistor 15 and a data input/output line signal amplifying p-channel MOS transistor 16 are connected in series between one data input/output line DQ and a power source potential $V_{CC}$, and a column selecting p-channel MOS transistor 17 and a data input/output line signal amplifying p-channel MOS transistor 18 are connected in series between the other data input/output line $\overline{DQ}$ and the power source potential $V_{CC}$. The gates of both the column selecting transistors 15 and 17 are connected to a column line $\overline{\text{CSL}}$ receiving a signal which is set to be "L" level in an active state, and the gate of the data input/output line signal amplifying transistor 16 is connected to the bit line $\overline{\text{BL}}$, and the gate of the data input/output line signal amplifying transistor 18 is connected to the bit line BL. A load n-channel MOS transistor 28 is inserted between a node A and the ground potential $V_{SS}$, and a load n-channel MOS transistor 29 is inserted between the node B and the ground potential $V_{SS}$. The gates of both the transistors 28 and 29 are commonly connected to a node B. That is, a data input/output line sense amplifier for amplifying a potential difference between the pair of data input/output lines in accordance with signals from the bit lines BL and $\overline{\text{BL}}$ consists of the p-channel MOS transistor 16 and 18 and the n-channel MOS transistors 28 and 29.

A data write p-channel MOS transistor 19 is connected between the node A and the bit line BL, and a data write p-channel MOS transistor 20 is connected between the node B and the bit line $\overline{\text{BL}}$. The gates of both the data write transistors 19 and 20 are connected to a data write control line $\overline{\text{WRT}}$ receiving a signal which is set to be "L" level in an active state.

FIG. 14 is a circuit diagram showing an arrangement of a DRAM according to the eighth embodiment of the present invention.

In the DRAM of this embodiment, in place of connecting one terminal of each of the p-channel MOS transistors 16 and 18 to the power source potential $V_{CC}$ in the DRAM of the above embodiment in FIG. 13, a through current control p-channel MOS transistor 30 is inserted between both the transistors 16 and 18 and the power source potential $V_{CC}$, and the gate of the through current control p-channel MOS transistor 30 is connected to a column selecting line $\overline{\text{CSL}}$. Therefore, as in the DRAM of the above embodiment in FIG. 10, a large number of non-selected data input/output line sense amplifiers can be prevented from a through current flow.

In the DRAM of the above embodiments, although the signals from the pair of data input/output lines are amplified immediately when the signal from the sense amplifying the signals from the pair of bit lines. When a data input/output line sense amplifier (for example, consisting of the n-channel MOS transistors 11 and 12 in the embodiment in FIG. 3, consisting of the p-channel MOS transistors 16 and 18 in the embodiment in FIG. 6, and consisting of the two CMOS inverters 22 and 24 in the embodiment in FIG. 9, respectively) has a high sensitivity, the signals from the pair of data input/output lines can be started to be amplified before the signals from the pair of bit lines are amplified. That is, when a signal from a word line WL rises and a micro signal from a memory cell is transmitted to the pair of bit lines, the pair of data input/output lines may be immediately started to be operated so as to quickly amplify the signal output to the pair of data input/output lines. In this case, thereafter, the bit line sense amplifier relatively slowly amplifies the potential difference between the pair of bit lines.

FIG. 15 is a circuit diagram showing an arrangement of a DRAM according to the ninth embodiment of the present invention.

In the DRAMs of the above embodiments, although one data input/output line sense amplifier is arranged for each pair of bit lines, one data input/output line sense amplifier may be arranged in units of plural pairs of bit lines. In the DRAM of this embodiment, one data input/output line sense amplifier is arranged for every four pairs of bit lines.

Referring to FIG. 15, four CMOS-S/A 41 correspond to the bit line sense amplifiers each of which consists of, e.g., the two n-channel transistors 3 and 4 and the p-channel MOS transistors 5 and 6 described in FIG. 3. A DQ S/A 42 in FIG. 15 corresponds to the bit line sense amplifier which consists of, e.g., the two n-channel MOS transistors 11 and 12 described in FIG. 3, and the DQ S/A 42 includes the data write n-channel MOS transistors 13 and 14.

The four bit line sense amplifiers (CMOS S/A) 41 are connected between a pair of bit lines BL0 and $\overline{\text{BL0}}$ to a pair of bit lines BL3 and $\overline{\text{BL3}}$, respectively, so as to be activated in accordance with signals from the sense amplifier control lines $\overline{\text{SAN}}$ and SAP. The four pairs of bit lines $\overline{\text{BL0}}$ and BL0 to BL3 and $\overline{\text{BL3}}$ are connected to the DQ S/A 42 through n-channel transistors 43 on the BL side and through n-channel transistors 44 on the $\overline{\text{BL}}$ side. The gates of the transistors 43 and 44 are commonly connected to each pair of bit lines, and four column selecting lines CSL0 to CSL3 are connected to the common gates. In addition, the output from an OR gate 45 receiving signals from the four column selecting lines CSL0 to CSL3 is supplied to the gates of the two column selecting n-channel MOS transistors 7 and 8 connected between the DQ S/A 42 and one of the pair of data input/output lines and between the DQ S/A 42 and the other of the pair of data input/output lines.

In the DRAM with the above arrangement, any one of the signals from the four column selecting lines CSL0 to CSL3 is set to be "H" level, any one of the four pairs of transistors 43 and 44 is turned on, and any one of the four CMOS S/As 41 is selectively connected to the DQ S/A 42. At this time, the output of the OR gate 45 goes to "H" level so as to activate the DQ S/A 42.

The DRAM of this embodiment is effectively used, when the area of the data input/output line sense amplifiers on a silicon chip is too large to arrange a data input/output line sense amplifier to each pair of bit lines, when a data input/output line sense amplifier is arranged for each pair of bit lines such that a chip area is increased exceeding an allowable range, or the like.

Figure 16:
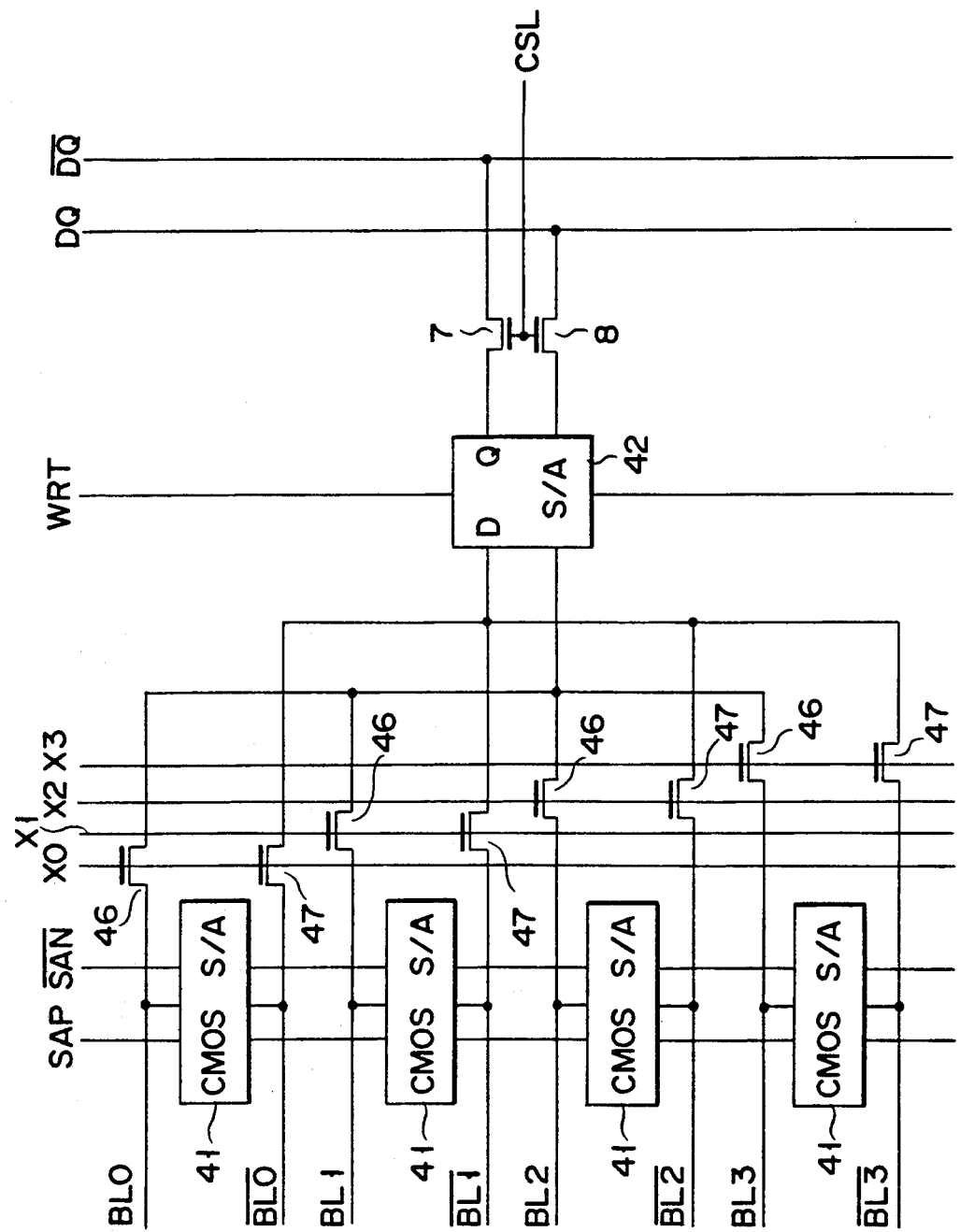
FIG. 16 is a circuit diagram showing an arrangement of a DRAM according to the tenth embodiment of the present invention.

FIG. 16 is a circuit diagram showing an arrangement of a DRAM according to the tenth embodiment of the present invention.

In this embodiment, one data input/output line sense amplifier is arranged for each of plural pairs of bit lines. Referring to FIG. 16, four bit line sense amplifiers 41 are connected between a pair of bit lines BL0 and $\overline{\text{BL0}}$ to a pair of bit lines BL3 and $\overline{\text{BL3}}$, respectively and activated in accordance with signals from sense amplifier control lines $\overline{\text{SAN}}$ and SAP. In addition, the four pairs of bit lines BL0 and $\overline{\text{BL0}}$ to BL3 and $\overline{\text{BL3}}$ are connected to the DQ S/A 42 through n-channel MOS transistors 46 on the BL side and through n-channel MOS transistors 47 on the $\overline{\text{BL}}$ side. The gates of the transistors 46 and 47 are commonly connected to each pair of bit lines, and four decode signal lines X0 to X3 are connected to the common gates, respectively. A column selecting line CSL is connected to the gates of two column selecting n-channel MOS transistors 7 and 8 respectively connected between the DQ S/A 42 and data input/output line DQ and between the DQ S/A 42 and data input/output line $\overline{\text{DQ}}$.

In the DRAM with the above arrangement, any one of signals from the four decode signal lines X0 to X3 goes to "H" level, any one of four pairs of transistors 46 and 47 are turned on such that any one of the four CMOS S/A 41 is selectively connected to the DQ S/A 42. In this case, the DQ S/A 42 is activated in accordance with a signal from the column CSL.

As in the embodiment in FIG. 15, the DRAM of this embodiment is used, effectively when an area of the data input/output line sense amplifiers is too large to arrange a data input/output line sense amplifier for each pair of bit lines, when a data input/output line sense amplifier is arranged to each pair of bit lines such that a chip area is increased exceeding an allowable range.

In embodiments in FIGS. 15 and 16, one data input/output line sense amplifier is arranged to each of four pairs of bit lines. However, one data input/output line sense amplifier may be arranged in units of two, four, eight, or sixteen pairs of bit lines. In general, one data input/output sense amplifier can be arranged in units of $2^n$ (n is a natural number) pairs of bit lines.

The present invention is not limited to the above described embodiments, and various modifications can be made. For example, in the above embodiments in FIGS. 9 and 10, p-channel MOS transistors can be used as the column selecting transistors 7 and 8 and the data write transistors 13 and 14. Similarly, in the embodiments in FIGS. 11 and 12, p-channel MOS transistors can be used as the column selecting transistors 7 and 8 and the data write transistors 13 and 14. In addition, in the embodiments in FIGS. 11 and 12, the n-channel MOS transistors 11 and 12 are used as driver transistors of the data input/output line sense amplifiers, and the p-channel MOS transistors 26 and 27 are used as current mirror load transistors. However, in this case, p-channel MOS transistors may be used as the driver transistors, and n-channel MOS transistors may be used as the current mirror load transistors.

As described above, according to the present invention, a dynamic type semiconductor memory device in which signal transmission on a data write path from a bit line to a data input/output line is rarely delayed, thereby obtaining a high-speed operation.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A dynamic type semiconductor memory device, comprising:
   a plurality of memory cells each consisting of a MOS transistor and a capacitor;
   a bit line pair connected to said memory cells, said bit line pair consisting of first and second bit lines;
   a sense amplifier connected to said bit line pair for amplifying a potential difference between said first and second bit lines;
   a data input/output line pair consisting of first and second data input/output lines for inputting data to and outputting data from said bit line pair;
   a first drive MOS transistor having a first terminal coupled to a first potential and a gate connected to one of said first and second bit lines, for extracting charges from one of said first and second input/output lines in the data reading operation, and for amplifying data input/output line signals;
   a second driver MOS transistor having a first terminal coupled to said first potential and a gate connected to the other of said first and second bit lines, for extracting charges from the other of said first and second input/output lines in the data reading operation, and for amplifying data input/output line signals;
   a first column selecting transistor having a first terminal connected to said one of said first and second data input/output lines, a second terminal connected to a second terminal of said first driver MOS transistor, and gate connected to a column selection line;
   a second column selecting transistor having a first terminal connected to said other of said first and second data input/output lines, a second terminal connected to a second terminal of said second driver MOS transistor, and a gate connected to said column selection line;
   a first write transistor having a first terminal connected to said other of said first and second bit lines, a second terminal connected to said second terminal of said first driver MOS transistor, and a gate applied with a data write control signal for switching said first write transistor ON in a data writing operation; and
   a second write transistor having a first terminal connected to said one of said first and second bit lines, a second terminal connected to said second terminal of said second driver MOS transistor, and a gate applied with the data write control signal for switching said second write transistor ON in the data writing operation.

2. The memory device according to claim 1, wherein said sense amplifier for amplifying a potential difference is a CMOS sense amplifier including a first flip-flop consisting of two n-channel MOS transistors and a second flip-flop consisting of two p-channel MOS transistors,
   said first and second driver MOS transistors are n-channel MOS transistors,
   said first and second column selecting transistors are n-channel MOS transistors, and
   said first and second write transistors are n-channel MOS transistors.

3. The memory device according to claim 1, wherein said sense amplifier for amplifying a potential difference is a CMOS sense amplifier including a first flip-flop consisting of two n-channel MOS transistors and a second flip-flop consisting of two p-channel MOS transistors,
   said first and second driver MOS transistors are p-channel transistors,
   said first and second column selecting transistors are p-channel MOS transistors, and
   said first and second write transistors are p-channel MOS transistors.

4. The memory device according to claim 1, further comprising:
   a first load MOS transistor having a first terminal connected to said second terminal of said first driver MOS transistor, a second terminal connected to a second potential, and a gate connected to said one of said first and second bit lines; and
   a second load MOS transistor having a first terminal connected to said second terminal of said second driver MOS transistor, a second terminal connected to said second potential, and a gate connected to said one of said first and second bit lines, wherein said first and second load MOS transistors constitute a current mirror load.

5. The memory device according to claim 1, further comprising:
a current suppression MOS transistor having a first terminal connected to said first terminals of said first and second driver MOS transistors and a second terminal connected to said first potential.

6. The memory device according to claim 1, wherein said first potential is a ground potential.

7. The memory device according to claim 1, wherein said first potential is a power source potential $V_{CC}$.

8. A dynamic type semiconductor memory device, comprising:
a plurality of memory cells each consisting of MOS transistor and a capacitor;
a bit line pair connected to said memory cells, said bit line pair consisting of first and second bit lines;
a sense amplifier connected to said bit line pair, for amplifying a potential difference between said first and second bit lines;
a data input/output line pair consisting of first and second data input/output lines for inputting data to and outputting data from said bit line pair;
a first driver MOS transistor having a first terminal coupled to a first potential and a gate connected to one of said first and second bit lines, for extracting charges from one of said input/output lines in a data reading operation, and for amplifying data input/output line signals;
a second driver MOS transistor having a first terminal coupled to said first potential and a gate connected to the other of said first and second bit lines, for extracting charges from the other of said input/output lines in the data reading operation, and for amplifying data input/output line signals;
a first load MOS transistor having a first terminal connected to a second terminal of said first driver MOS transistor, a second terminal connected to a second potential, and a gate connected to said gate of said first driver MOS transistor, whereby said first driver MOS transistor and said first load MOS transistor constitute a first CMOS inverter;
a second load MOS transistor having a first terminal connected to a second terminal of said second driver MOS transistor, a second terminal connected to said second potential, and a gate connected to said gate of said second driver MOS transistor, whereby said second driver MOS transistor and said second load MOS transistor constitute a second CMOS inverter;
a first column selecting transistor having a first terminal connected to said one of said first and second data input/output lines; a second terminal connected to said second terminal of said first driver MOS transistor, and a gate connected to a column selection line;
a second column selecting transistor having a first terminal connected to said other of said first and second data input/output lines, a second terminal connected to said second terminal of said second driver MOS transistor, and a gate connected to said column selection line;
a first write transistor having a first terminal connected to said other of said first and second bit lines, a second terminal connected to said second terminal of said first driver MOS transistor and a gate applied with a data write control signal for switching said first write transistor ON in a data writing operation; and
a second write transistor having a first terminal connected to said one of said first and second bit lines, a second terminal connected to said second terminal of said second driver MOS transistor, and a gate applied with the data write control signal for switching said second write transistor ON in the data writing operation.

9. The memory device according to claim 8, further comprising:
a current suppression MOS transistor having a first terminal connected to said first terminals of said first and second driver MOS transistors and a second terminal connected to said first potential.

10. The memory device according to claim 8, further comprising:
a current suppression MOS transistor having a first terminal connected to said first terminals of said first and second driver MOS transistors, a second terminal connected to said first potential, and a gate connected to said column selection line.

11. The memory device according to claim 8, wherein said first potential is a ground potential.

12. The memory device according to claim 8, wherein said first potential is a power source potential Vcc.

13. A dynamic type semiconductor memory device, comprising:
a plurality of memory cells each consisting of a MOS transistor and a capacitor;
bit line pairs connected to said memory cells, each bit line pair consisting of first and second bit lines;
sense amplifiers each connected to one of said bit line pairs for amplifying a potential difference between said first and second bit lines;
a data input/output line pair consisting of first and second data input/output lines for inputting data to and outputting data from said bit line pairs;
a first driver MOS transistor having a first terminal coupled to a first potential, for extracting charges from one of said first and second input/output lines in a data reading operation, and for amplifying data input/output line signals;
a second driver MOS transistor having a first terminal coupled to said first potential, for extracting charges from the other of said first and second input/output lines in the data reading operation, and for amplifying data input/output line signals;
bit line pair selecting means, connected to gates of said first and second driver MOS transistors, for selecting one bit line pair from said plurality of bit line pairs in accordance with an address;
a first column selecting transistor having a first terminal connected to said one of said first and second data input/output lines, a second terminal connected to a second terminal of said first driver MOS transistor, and a gate connected to a column selection line;
a second column selecting transistor having a first terminal connected to said other of said first and second data input/output lines, a second terminal connected to a second terminal of said second driver MOS transistor, and a gate connected to said column selection line;
a first write transistor having a first terminal connected to said bit line pair selecting means, a second terminal connected to said second terminal of said first driver MOS transistor, and a gate supplied with a data write control signal for switching said first write transistor ON in a data writing operation; and a second write transistor having a fist terminal connected to said bit line pair selecting means, a second terminal connected to said second terminal of said second driver MOS transistor, and a gate applied with the data write control signal for switching said second write transistor ON in the data writing operation;

wherein said bit line pair selecting means has first and second output lines and wherein said gate of said first driver MOS transistor is connected to said second output line and said gate of said second driver MOS transistor is connected to said first output line, and said first terminal of said first write transistor is connected to said first output line and said first terminal of said second write transistor is connected to said second output line.

14. A dynamic type semiconductor memory device, comprising:

a plurality of memory cells each consisting of a MOS transistor and a capacitor;

bit line pairs connected to said memory cells, each bit line pair consisting of first and second bit lines;

sense amplifiers each connected to one of said bit line pairs for amplifying a potential difference between said first and second bit lines;

a data input/output line pair consisting of first and second data input/output lines for inputting data to and outputting data from said bit line pairs;

a first driver MOS transistor having a first terminal coupled to a first potential, for extracting charges from one of said first and second input/output lines in a data reading operation, and for amplifying data input/output line signals;

a second driver MOS transistor having a first terminal coupled to said first potential, for extracting charges from the other of said first and second input/output lines in the data reading operation, and for amplifying data input/output line signals;

a first load MOS transistor having a first terminal connected to a second terminal of said first driver MOS transistor, a second terminal connected to a second potential, and a gate connected to a gate of said first driver MOS transistor, whereby said first driver MOS transistor and said first load MOS transistor constitute a first CMOS inverter;

a second load MOS transistor having a first terminal connected to a second terminal of and second driver MOS transistor, a second terminal connected to said second potential, and a gate connected to a gate of said second driver MOS transistor, whereby said second driver MOS transistor and said second load MOS transistor constitute a second CMOS inverter;

bit line pair selecting means, connected to said gates of said first and second driver MOS transistors, for selecting one bit line pair from said plurality of bit line pairs in accordance with an address;

a first column selecting transistor having a first terminal connected to one of said first and second data input/output lines, a second terminal connected to said second terminal of said first driver MOS transistor, and a gate connected to a column selection line;

a second column selecting transistor having a first terminal connected to said other of said first and second data input/output lines, a second terminal connected to said second terminal of said second driver MOS transistor, and a gate connected to said column selection line;

a first write transistor having a first terminal connected to said bit line pair selecting means, a second terminal connected to said second terminal of said first driver MOS transistor, and a gate supplied with a data write control signal to switch said first write transistor ON in a data writing operation; and a second write transistor having a first terminal connected to said bit line pair selecting means, a second terminal connected to said second terminal of said second driver MOS transistor, and a gate applied with the data write control signal to switch said second write transistor ON in the data writing operation;

wherein said bit line pair selecting means has first and second output lines and wherein said gate of said first driver MOS transistor is connected to said second output line and said gate of said second driver MOS transistor is connected to said first output line, and said first terminal of said first write transistor is connected to said first output line and said first terminal of said second write transistor is connected to said second output line.

* * * * *